United States Patent
Upadhyaya et al.

(10) Patent No.: US 8,836,391 B2
(45) Date of Patent: Sep. 16, 2014

(54) PLESIOCHRONOUS CLOCK GENERATION FOR PARALLEL WIRELINE TRANSCEIVERS

(71) Applicant: Xilinx, Inc., San Jose, CA (US)

(72) Inventors: Parag Upadhyaya, Los Gatos, CA (US); Jafar Savoj, Sunnyvale, CA (US); Anthony Torza, San Francisco, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 13/633,584

(22) Filed: Oct. 2, 2012

(65) Prior Publication Data

US 2014/0091843 A1  Apr. 3, 2014

(51) Int. Cl.
  *H03L 7/06*  (2006.01)
  *H03L 7/087*  (2006.01)
  *H03L 7/089*  (2006.01)

(52) U.S. Cl.
  CPC .............. *H03L 7/087* (2013.01); *H03L 7/0891* (2013.01)
  USPC ........... 327/158; 327/147; 327/156; 375/371; 375/375; 375/376

(58) Field of Classification Search
  USPC ........... 327/147, 156, 158; 375/371, 375, 376
  See application file for complete search history.

(56) References Cited

U.S. PATENT DOCUMENTS

| | | |
|---|---|---|
| 2009/0015304 A1 | 1/2009 | Yin et al. |
| 2009/0212835 A1 | 8/2009 | Xu et al. |
| 2009/0232262 A1 | 9/2009 | Ku et al. |
| 2010/0166084 A1 | 7/2010 | Galton et al. |
| 2011/0007859 A1* | 1/2011 | Ueda et al. ..................... 375/376 |

OTHER PUBLICATIONS

Kim J.Y. et al., "A programmable 25 MHz to 6 GHz rational –K/L frequency synthesizer with digital Kvco compensation", Circuits and Systems, 2008 ISCAS 2008, IEEE International Symposium on IEEE, Piscataway, NJ, USA, May 18, 2008, pp. 2629-2632.
Yao, Chih-Wei et al., "Frequency synthesis with arbitrary input clock rate and rational K/L multiplier ratio", Circuits and Systems, 2009 ISCAS 2009, IEEE International Symposium on IEEE, Piscataway, NJ, USA, May 24, 2009, pp. 1365-1368.

* cited by examiner

*Primary Examiner* — John Poos
(74) *Attorney, Agent, or Firm* — Gerald Chan

(57) ABSTRACT

A method for plesiochronous clock generation for parallel wireline transceivers, includes: inputting, into at least one decoder, at least one digital frequency mismatch number; decoding, with the at least one decoder, the at least one digital frequency mismatch number to obtain at least one digital frequency divider number that represents a transmit frequency associated with at least one signal; inputting the at least one digital frequency divider number into at least one fractional-N phase lock loop; and utilizing, by the at least one fractional-N phase lock loop, the at least one digital frequency divider number and an analog reference signal produced by a reference oscillator to produce a resultant signal at the transmit frequency; wherein the at least one decoder and the at least one fractional-N phase lock loop are contained on a single integrated circuit.

20 Claims, 6 Drawing Sheets

PLESIOCHRONOUS CLOCK GENERATION FOR PARALLEL WIRELINE TRANSCEIVERS

FIELD OF THE APPLICATION

An embodiment described herein relates to plesiochronous clock generation. In particular, it relates to plesiochronous clock generation for parallel wireline transceivers.

BACKGROUND

Currently, in a number of optical standards, the data rates of multiple incoming fiber optic lines are slightly different because they are initiated from sources with very close reference frequencies. Depending upon the application, it may be desirable to retime, decode, and re-transmit the data at the same frequency of the original transmitter.

SUMMARY

In accordance with one embodiment, a method includes: inputting, into at least one decoder, at least one digital frequency mismatch number; decoding, with the at least one decoder, the at least one digital frequency mismatch number to obtain at least one digital frequency divider number that represents a transmit frequency associated with at least one signal; inputting the at least one digital frequency divider number into at least one fractional-N phase lock loop; and utilizing, by the at least one fractional-N phase lock loop, the at least one digital frequency divider number and an analog reference signal produced by a reference oscillator to produce a resultant signal at the transmit frequency; wherein the at least one decoder and the at least one fractional-N phase lock loop are included in a single integrated circuit.

In accordance with another embodiment, a system includes: at least one decoder configured to decode at least one digital frequency mismatch number in order to obtain a digital frequency divider number that represents a transmit frequency associated with at least one signal; and a fractional-N phase lock loop for each of the at least one digital frequency mismatch number; wherein the fractional-N phase lock loop is configured to utilize the digital frequency divider number associated with the at least one digital frequency mismatch number and an analog reference signal produced by a reference oscillator to produce a resultant signal at the transmit frequency, wherein the at least one decoder and the fractional-N phase lock loop are included in a single integrated circuit.

Other and further aspects and features will be evident from reading the following detailed description of the embodiments.

DESCRIPTION OF THE FIGURES

The drawings illustrate the design and utility of embodiments, in which similar elements are referred to by common reference numerals. These drawings are not necessarily drawn to scale. In order to better appreciate how the above-recited and other advantages and objects are obtained, a more particular description of the embodiments will be rendered, which are illustrated in the accompanying drawings. These drawings depict only typical embodiments and are not therefore to be considered limiting of the scope of the claims.

DETAILED DESCRIPTION

Figure 1:
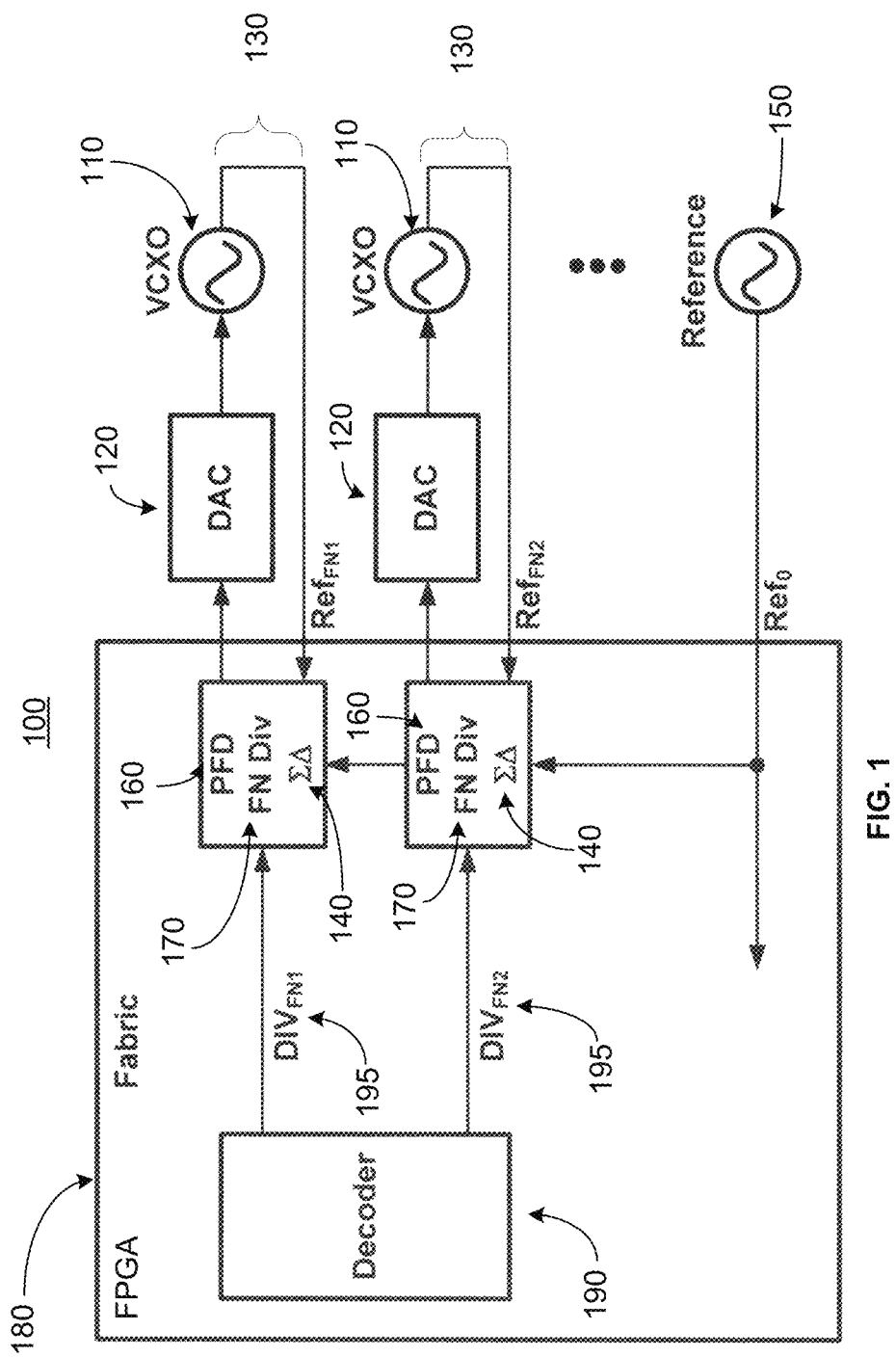
FIG. 1 is an illustration of a system for plesiochronous clock generation for parallel wireline transceivers.

Various embodiments are described hereinafter with reference to the figures. It should be noted that the figures are not drawn to scale and that elements of similar structures or functions are represented by like reference numerals throughout the figures. It should also be noted that the figures are only intended to facilitate the description of the embodiments. They are not intended as an exhaustive description of the claimed invention or as a limitation on the scope of the claimed invention. In addition, an illustrated embodiment needs not have all the aspects or advantages shown. An aspect or an advantage described in conjunction with a particular embodiment is not necessarily limited to that embodiment and can be practiced in any other embodiments even if not so illustrated, or if not so explicitly described.

An embodiment of a system described herein addresses the need described above by utilizing a plurality of fractional-N phase lock loops (FNPLLs) operating from a single system clock. FNPLLs are employed because they can provide a very fine divide ratio (e.g., up to twenty (20) bits of resolution) in order to lock the voltage controlled oscillator (VCO) output to the local reference. The fraction in the divide ratio reflects the ppm (parts per million) difference in frequency between the local and remote system clocks. The embodiment of the system provides a significant power advantage compared to the prior art designs that are currently employed to address this need. This is because the disclosed system employs at least one fractional-N phase lock loop (FNPLL) that is integrated/manufactured into a quad transceiver of an integrated circuit (IC) such as, e.g., a field programmable gate array (FPGA). The power penalty for the disclosed design does not exceed a few milliwatts (mW) per quad transceiver.

A general-purpose field programmable gate array (FPGA) may be configured to operate in a variety of different modes. One particular mode relevant to the system of the present disclosure is when quad transceivers of the FPGA operate at very close, but not equal, data rates. This particular scenario arises, for example, when the FPGA is used for optical communication networks in which data lines from multiple sources with slightly different reference frequencies are bundled into one optical link. The optical signal additionally carries information about the speed mismatch of these data sequences in the form of a digital number. Upon optical demultiplexing at the receiver side, the signals are split into different lanes, and the digital frequency mismatch number is decoded. The FPGA on the receiver side uses this information to retime and retransmit each data sequence with the same frequency as the one of the source.

FIG. 1 depicts a system design 100 to address this issue. In particular, FIG. 1 is an illustration of a system 100 for plesiochronous clock generation for parallel wireline transceivers, in accordance with at least one embodiment. The system 100 relies on multiple external (i.e. not integrated into the FPGA 180 fabric) voltage-controlled crystal oscillators (VCXOs) 110 and digital-to-analog converters (DACs) 120. These blocks 110, 120 form hybrid fractional-N phase lock loops (PLLs) 130 with sigma-delta modulators (SDMs or ΣΔs) 140 in which the loops 130 lock each of their respective VCXOs 110 to a frequency at a fractional ratio of the input reference frequency produced by the external reference oscillator 150. The phase-frequency detector (PFD) 160, the fractional-N divider (FN Div) 170, and the sigma-delta modulator (SDM or ΣΔ) 140 of each of the hybrid fractional-N phase lock loops (PLLs) 130 are formed inside the FPGA 180 fabric. In addition, the decoder 190, which is used to decode the digital frequency mismatch numbers to obtain their respective digital frequency divider information (e.g., $DIV_{FN1}$, $DIV_{FN2}$) 195 regarding the original transmission frequency of the source, is also formed inside the FPGA 180 fabric. The system 100 can resolve a fine ppm (parts per million) difference between the reference oscillator 150 and the VCXO 110 clocks by using a fractional divide ratio with up to twenty (20) bits of resolution. In practice, the resolution is limited by the quality of the external DACs 120 and the VCXOs 110.

It should be noted this system 100 requires a very costly build of material (BOM) due to the required number of external DACs and VCXOs. In addition, it should be noted that the large power consumption of these external components increases the total power consumption of the system 100 by a few Watts (W) as well as complicates the cooling design and system design 100.

Figure 2:
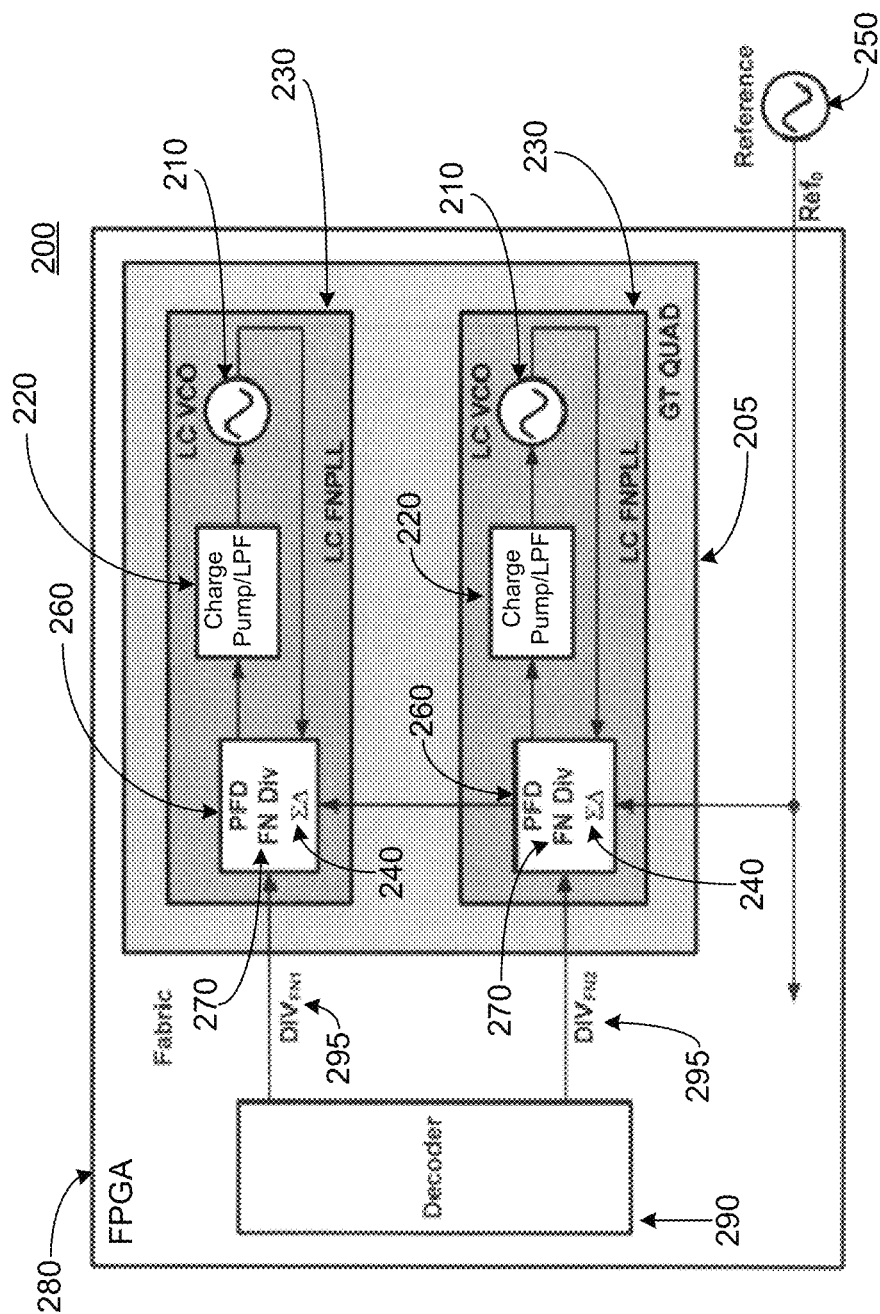
FIG. 2 is an illustration of the disclosed system for plesiochronous clock generation for parallel wireline transceivers where a decoder and fractional-N phase lock loops are contained on a single field programmable gate array (FPGA), in accordance with some embodiments.

FIG. 2 is an illustration of a system 200 for plesiochronous clock generation for parallel wireline transceivers, where a decoder 290 and fractional-N phase lock loops 230 are contained on a single field programmable gate array (FPGA) 280, in accordance with at least one embodiment. This system 200 design alleviates the need for external components by using, for clock generation, the integrated inductor-capacitor voltage controlled oscillators (LC VCOs) that are located inside each quad transceiver 205 of the FPGA 280 fabric. As shown in FIG. 2, each quad transceiver 205 contains one or more inductor-capacitor fractional-N phase lock loops (LC FNPLLs) 230. Each LC inductor-capacitor fractional-N phase lock loop (FNPLL) 230 includes a high-performance oscillator (e.g., a LC VCO) 210, a charge pump/low pass filter (LPF) 220, a phase-frequency detector (PFD) 260, a sigma-delta modulator (SDM or ΣΔ) 240, and a fractional-N divider (FN Div) 270. It should be noted that in legacy quad transceiver systems, the divider inside the phase lock loop (PLL) is an integer-N divider and, as such, the PLL can only produce frequencies that are integer multiples of the input reference frequency.

In the disclosed system 200, the divider inside each LC FNPLL 230 is a fractional-N divider (FN Div) 270. In addition, a custom-built SDM 240 is added to each LC FNPLL 230. For this design 200, the digital code (i.e. the digital frequency divider number) 295 reflecting the ppm (parts per million) difference in frequency between the data lines with the reference signal is programmed in the fractional divider (FN Div) 270. The LC FNPLL 230 locks the LC VCO 210 frequency to a fractional multiple of the local reference frequency of the reference oscillator 250. This guarantees that the LC FNPLL 230 produces a frequency that is similar to that of the remote source.

As previously mentioned above, it should be noted that the system 200 provides a significant power advantage compared to the system design 100 of FIG. 1 because the system design 200 employs at least one fractional-N phase lock loop (FN-PLL) 230 that is integrated into a quad transceiver 205 of a field programmable gate array (FPGA). The only power penalty for this design comes from the new fractional divider (FN Div) 270 and the added sigma-delta modulator (SDM) 240 of each LC FNPLL 230. The power penalty for the system design 200 does not exceed a few milliwatts (mW) per quad transceiver 205.

In order to better understand the system 200 depicted in FIG. 2, a brief description of the method of operation of the system 200 is presented. At the beginning of the method, at least one digital frequency mismatch number (not shown) is inputted into the decoder 290. The decoder 290 decodes the digital frequency mismatch number(s) to obtain a digital frequency divider number ($DIVF_{N1}$, $DIVF_{N2}$) 295. The digital frequency divider number ($DIVF_{N1}$, $DIVF_{N2}$) 295 indicates the divisor number needed to divide the frequency of the reference oscillator signal in order to obtain the original transmit frequency of the source. For example, if the frequency of the reference oscillator signal is 10 megahertz (MHz) and the frequency of the original transmitted signal from the source is 5 MHz, then the frequency divider number 295 will be 2.

Then, each digital frequency divider number ($DIVF_{N1}$, $DIV_{FN2}$) 295 is inputted into its respective fractional-N phase lock loop (FNPLL) 230. It should be noted that in one or more embodiments, the fractional-N phase lock loops (FNPLLs) 230 are LC FNPLLs. Each FNPLL 230 uses the digital frequency divider number 295 and an analog reference signal produced by the external reference oscillator 250 to produce a resultant signal at the transmit frequency of the original source.

In particular, for each FNPLL 230, a digital frequency divider number 295 is inputted into a detector 260. In one or more embodiments, a phase frequency detector (PFD) is employed for the detector 260. A first converter 240 converts an analog signal produced by the voltage controlled oscillator (VCO) 210 to a digital output signal, and a second converter 240 converts the analog reference signal produced by the reference oscillator 250 to a digital reference signal.

Figure 3:
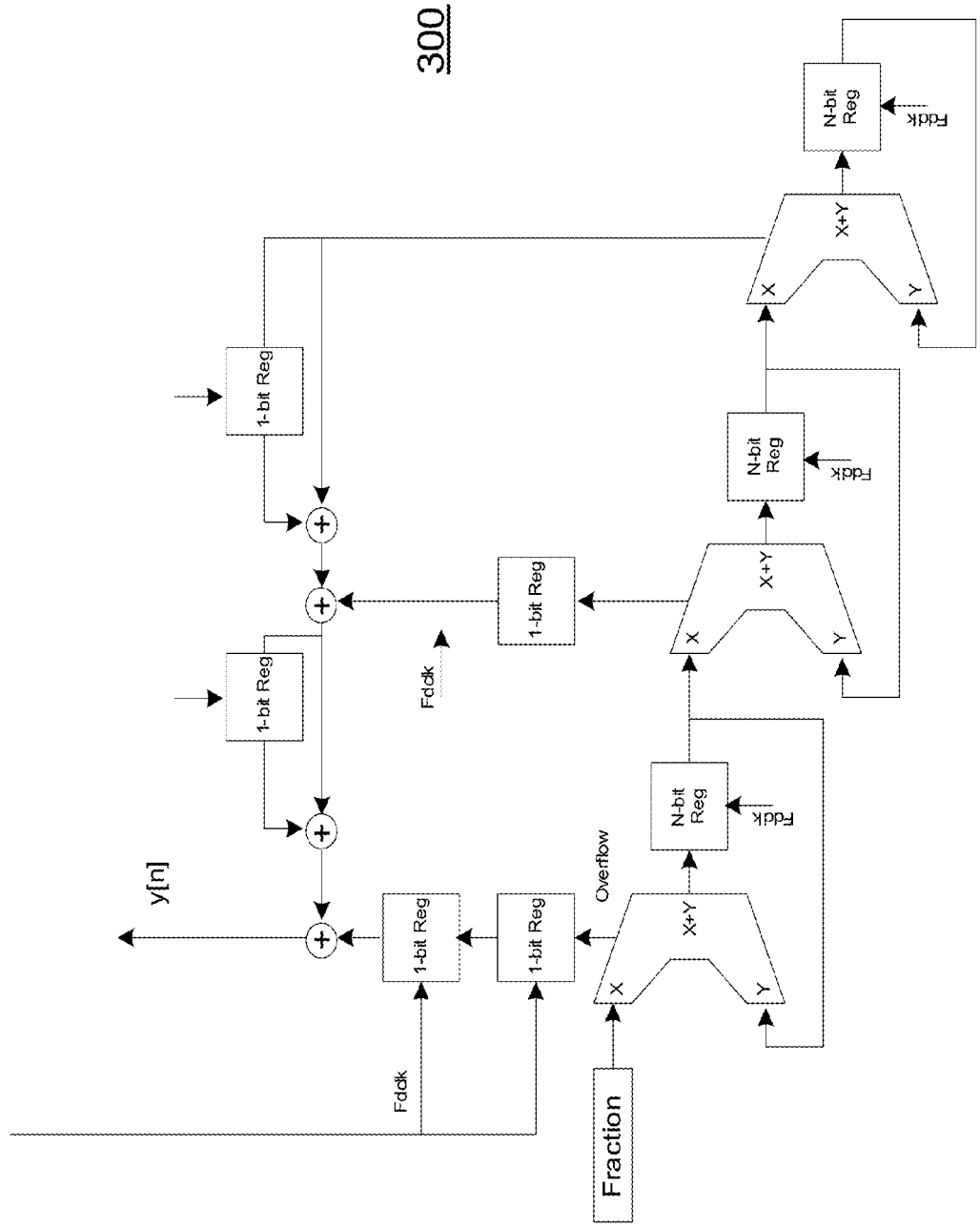
FIG. 3 is an illustration of a block diagram of an exemplary sigma-delta modulator (SDM) that may be employed by the disclosed system of FIG. 2, in accordance with some embodiments.

It should be noted that in various embodiments, sigma-delta modulators (SDMs or ΣΔs) are employed for the analog-to-digital converters 240. FIG. 3 is an illustration of a block diagram 300 of an exemplary sigma-delta modulator (SDM) that may be employed by the system 200 in some embodiments. The SDM encodes the analog signal using delta-sigma modulation, and then applies a digital filter to form a higher-resolution digital output. The temporary use of a lower-resolution signal simplifies the circuit design and improves efficiency.

In particular, the sigma delta modulator (SDM) shown in FIG. 3 is a third ($3^{rd}$) order mash sigma delta modulator. A mash sigma delta modulator can be used for noise shaping for a fractional-N PLL (e.g. for each FNPLL 230). The mash structure, as shown in FIG. 3, is a Mash 1-1-1 sigma delta modulator, which performs multi-stage noise shaping. The mash converter is a first order loop, and is unconditionally stable. By cascading the multi-states, a higher order sigma delta modulator can be achieved. A first ($1^{st}$) order sigma delta modulator provides 20 dB of noise shaping, a second ($2^{nd}$) order sigma delta modulator provides 40 dB of noise shaping, and a third ($3^{rd}$) order sigma delta modulator can provide 60 dB of noise shaping. The input to the sigma delta modulator (e.g., in the case of applying it to a FNPLL) is an N-bit fractional signal, which can be twenty (20) bits, for example. The function of the quantizer is to retain the integer part, and discard the fractional part. A mash modulator has a simple integration path, as only adders and registers are needed to implement the noise shaping function. In each stage of the MASH 1-1-1 structure, the quantization error is input into the next modulator. By summing the filtered versions of the first-order outputs, the quantization errors of the first and the second modulator are cancelled. Since the sigma delta modulator in the fractional-N PLLs 230 is an all digital implementation, the cancellation is perfect. The single stage of a delta sigma modulator consists of an accumulator and an N-bit register, as is shown in FIG. 3, where N can be 20 bits, for example.

Figure 4:
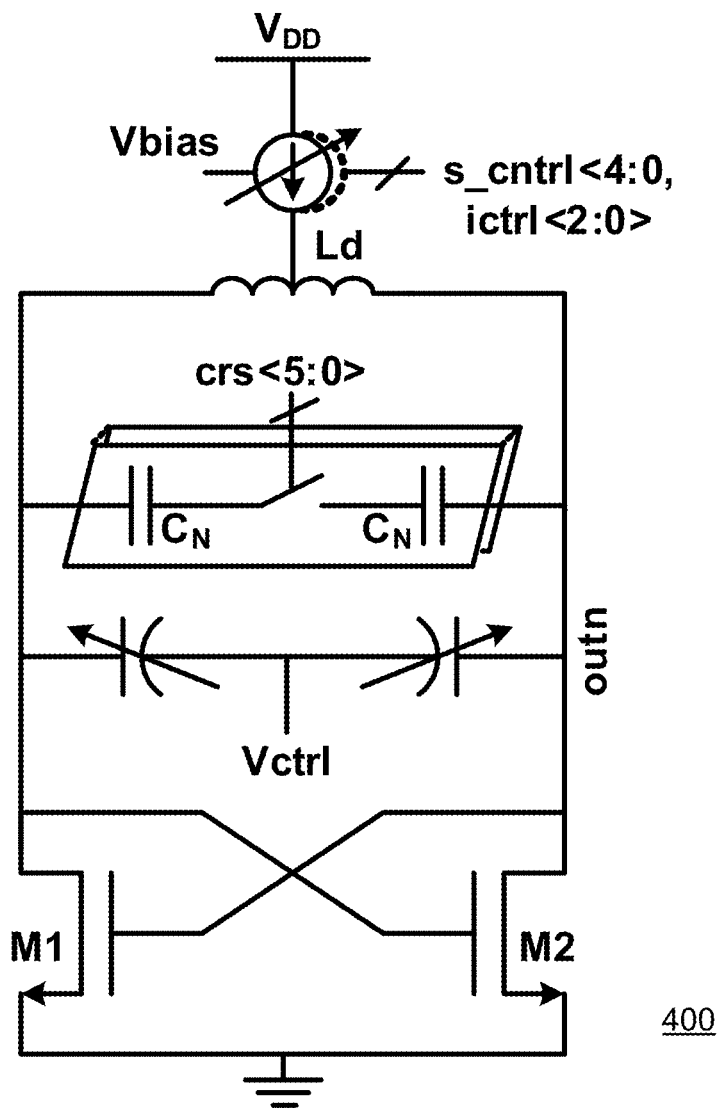
FIG. 4 is an illustration of a circuit diagram of an exemplary inductor-capacitor voltage controlled oscillator (LC VCO) that may be employed by the disclosed system of FIG. 2, in accordance with some embodiments.

In addition, it should be noted that in some embodiments, an inductor-capacitor voltage controlled oscillator (LC VCO) is employed for the VCO 210 of each FNPLL 230 of the disclosed system 200. FIG. 4 is an illustration of a circuit diagram 400 of an exemplary inductor-capacitor voltage controlled oscillator (LC VCO) that may be employed by the system 200 in some embodiments. Inductor-capacitor voltage controlled oscillators (LC VCOs) includes two main stages. These stages are the gain stage and the inductor-capacitor tank (LC tank). LC VCOs are a type of resonant oscillator, and can be designed for a fixed frequency or a variable frequency operation, which requires the use of a varactor (i.e. a back-biased diode). LC VCOs have very good phase noise and jitter performance at high frequencies.

Additionally, it should be noted that the LC VCO 210 of the system 200 of FIG. 2 is operating at a frequency that is much higher than the frequency of its associated reference oscillator 250. Conversely, the VCXO 110 of the system 100 of FIG. 1 is operating at a frequency that is very close to the frequency of its associated reference oscillator 150. Since the LC VCO 210 is operating at a frequency much higher than the frequency of its associated reference oscillator 250, the system design 200 has the benefit of having more flexibility in controlling the signal integrity of the LC VCO 210. This is because the fractional-N divider (FN Div) 270 is able to achieve a more accurate resulting frequency since it is dividing a higher frequency, and because the sigma-delta modulator (SDM or ΣΔ) 240 is able to better filter the noise.

Also, it should be noted that in at least one embodiment, a crystal oscillator is employed for the reference oscillator 250 of the disclosed system 200. In some embodiments of the present disclosure, the crystal oscillator is synchronized to Global Positioning System (GPS) timing.

Referring back to FIG. 2, after the signals are converted, the detector 260 compares the frequency of the digital output signal with the frequency of the digital reference signal to produce a digital frequency error measurement. Then, a third converter 240 converts the digital frequency error measurement to an analog frequency error measurement.

Figure 5:
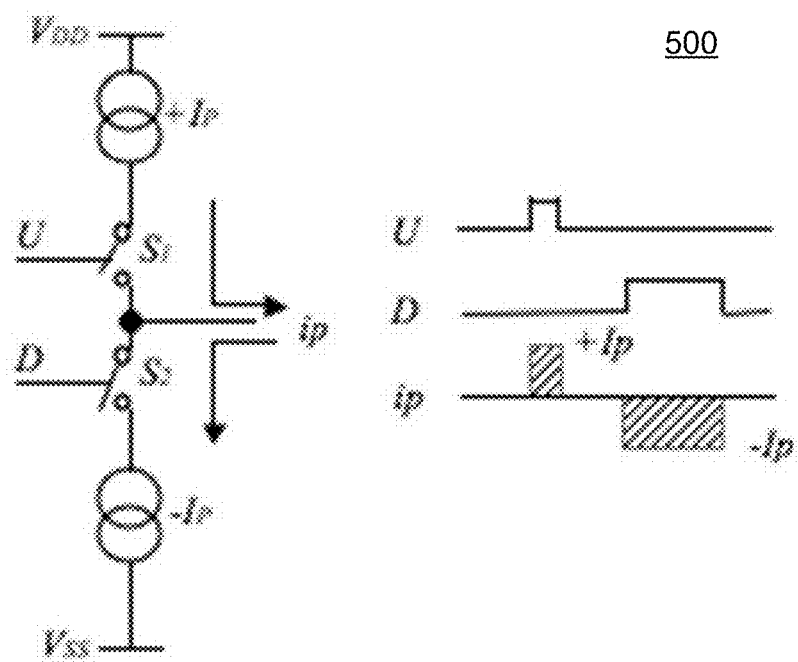
FIG. 5 is an illustration of a model of an exemplary charge pump that may be employed by the disclosed system of FIG. 2, in accordance with some embodiments.

In one or more embodiments, a charge pump is employed for the third converter 220 of the disclosed system 200. FIG. 5 is an illustration of a model 500 of an exemplary charge pump that may be employed by the disclosed system 200. The charge pump consists of a set of current sources and magnitudes of $I_{P1}$ and $I_{P2}$ amps, respectively. In most cases, the current sources are symmetrical and, thus, $I_{P1}$ is equal to $I_{P2}$ is equal to $I_P$. One source is connected to the positive supply rail, while the other source is connected to the negative supply rail. The sources are separated by two switches, $S_1$ and $S_2$. The output of the detector 260 provides the gating signals U (up) and D (down), which turn on $S_1$ and $S_2$, respectively. The detector 260 is designed such that the switches are never on simultaneously. When U is high and D is low, then $S_1$ is on and $S_2$ is off, which causes current to flow out of the pump. When U is low and D is high, then $S_1$ is off and $S_2$ is on, which causes the current to flow into the pump.

Referring back to FIG. 2, after the digital frequency error measurement is converted to an analog frequency error measurement, the analog frequency error measurement is then optionally passed through an analog low pass filter (LPF) (not shown). Then, the frequency error measurement is inputted into the voltage controlled oscillator 210 to correct the frequency of the analog output signal.

Figure 6:
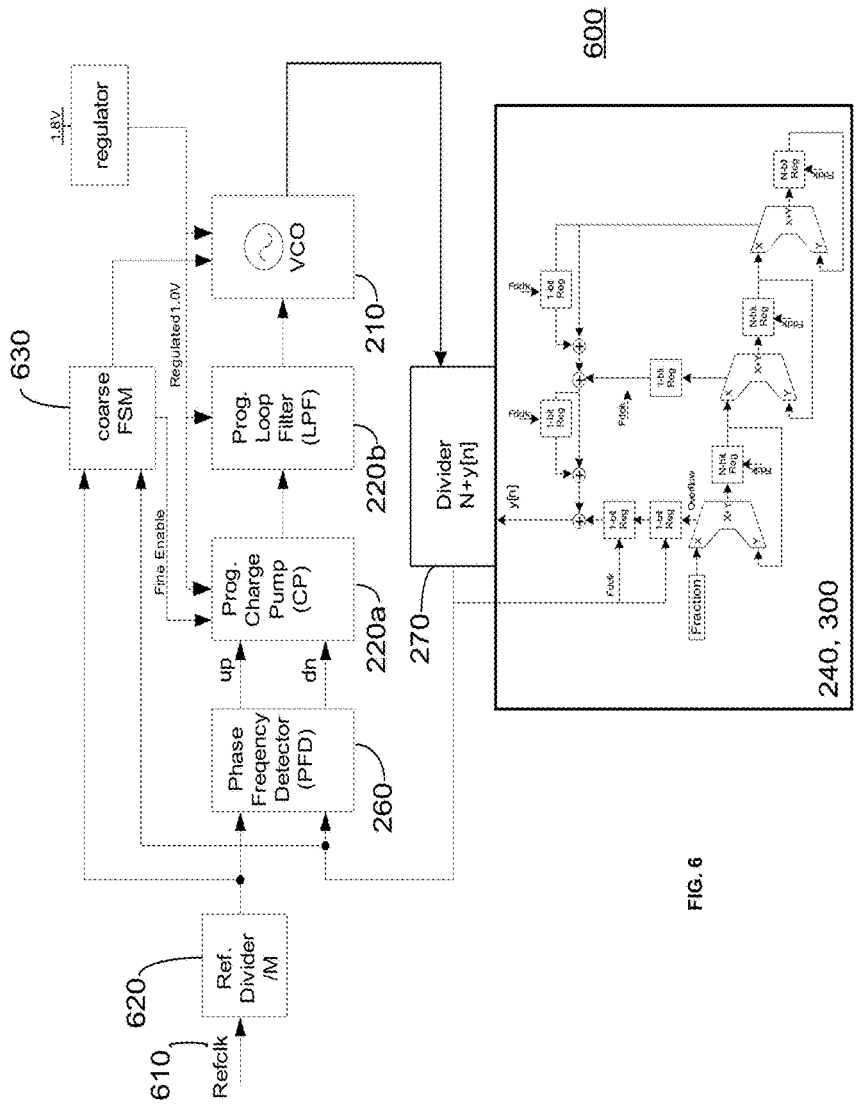
FIG. 6 is an illustration of the disclosed system for plesiochronous clock generation for parallel wireline transceivers where a decoder and fractional-N phase lock loops are contained on a single field programmable gate array (FPGA), where the disclosed system is employing a third ($3^{rd}$) order mash sigma delta modulator depicted in FIG. 3, in accordance with some embodiments.

FIG. 6 is an illustration of the disclosed system 600 for plesiochronous clock generation for parallel wireline transceivers where a decoder and fractional-N phase lock loops are contained on a single field programmable gate array (FPGA), where the disclosed system 600 is employing a third ($3^{rd}$) order mash sigma delta modulator 300 depicted in FIG. 3, in accordance with some embodiments. In particular, FIG. 6 illustrates an example configuration for the disclosed system 600 when the disclosed system employs a third ($3^{rd}$) order mash sigma delta modulator of FIG. 3 for the sigma delta modulator 240 depicted in FIG. 2.

For this figure, the external reference oscillator 250 (not shown) is inputting a signal (Refclk) 610 into a reference divider unit 620, where M may be 1, 2, 4, .... Then, a divided signal is outputted from the reference divider unit 620, and inputted into a coarse finite state machine (FSM) 630 and a phase frequency detector (PFD) 260. A signal is outputted from the PFD 206 and inputted into a charge pump 220a (i.e. a digital-to-analog converter) to convert the signal, which is a digital signal, to an analog signal. Then, an analog signal is outputted from the charge pump 220a and inputted into a low pass filter (LPF) 220b to filter the analog signal. After the analog signal is filtered by the LPF 220b, the filtered analog signal is outputted from the LPF 220b and inputted into a VCO 210. The output of the VCO 210 is then inputted into a divide-by-N+y[n] divider 270. A signal is then outputted from the divide-by-N+y[n] divider 270 to clock a SDM 240. In the illustrated embodiments, a third ($3^{rd}$) order mash sigma delta modulator 300 is employed for the SDM 240.

Although particular embodiments have been shown and described, it will be understood that they are not intended to limit the claimed inventions, and it will be obvious to those skilled in the art that various changes and modifications may be made without departing from the spirit and scope of the claimed inventions. The specification and drawings are, accordingly, to be regarded in an illustrative rather than restrictive sense. The claimed inventions are intended to cover alternatives, modifications, and equivalents.

What is claimed is:

1. A method, comprising:
   inputting at least one digital frequency mismatch number;
   decoding, with the at least one decoder, the at least one digital frequency mismatch number to obtain at least one digital frequency divider number that represents a transmit frequency associated with at least one signal;
   inputting the at least one digital frequency divider number into at least one fractional-N phase lock loop; and
   utilizing, by the at least one fractional-N phase lock loop, the at least one digital frequency divider number and an analog reference signal produced by a reference oscillator to produce a resultant signal at the transmit frequency;

wherein the at least one fractional-N phase lock loop is integrated into a transceiver of an integrated circuit, and wherein the integrated circuit includes the at least one decoder.

2. The method of claim 1, wherein the fractional-N phase lock loop is an inductor-capacitor fractional-N phase lock loop.

3. The method of claim 1, further comprising:
inputting, the at least one digital frequency divider number, into a detector;
converting, with a first converter, an analog output signal produced by a voltage controlled oscillator to a digital output signal;
converting, with a second converter, the analog reference signal produced by the reference oscillator to a digital reference signal;
comparing, with the detector, a frequency of the digital output signal with a frequency of the digital reference signal to produce a digital frequency error measurement;
converting, with a third converter, the digital frequency error measurement to an analog frequency error measurement; and
inputting, into the voltage controlled oscillator, the analog frequency error measurement to correct a frequency of the analog output signal.

4. The method of claim 3, wherein the first converter is a sigma-delta modulator, and the act of converting the analog output signal to the digital output signal is performed by the sigma-delta modulator.

5. The method of claim 3, wherein the second converter is a sigma-delta modulator, and the act of converting the analog reference signal to the digital reference signal is performed by the sigma-delta modulator.

6. The method of claim 3, wherein the third converter is a charge pump, and the act of converting the digital frequency error measurement to the analog frequency error measurement is performed by the charge pump.

7. The method of claim 3, wherein the voltage controlled oscillator is an inductor-capacitor voltage controlled oscillator.

8. The method of claim 3, further comprising passing the analog frequency error measurement through an analog low pass filter before inputting the analog frequency error measurement into the voltage controlled oscillator.

9. The method of claim 3, wherein the detector is a phase frequency detector, and the act of comparing the frequency of the digital output signal with the frequency of the digital reference signal is performed by the phase frequency detector.

10. A system, comprising:
at least one decoder configured to decode at least one digital frequency mismatch number in order to obtain a digital frequency divider number that represents a transmit frequency associated with at least one signal; and
a fractional-N phase lock loop for each of the at least one digital frequency mismatch number, wherein the fractional-N phase lock loop is configured to utilize the digital frequency divider number associated with the at least one digital frequency mismatch number and an analog reference signal produced by a reference oscillator to produce a resultant signal at the transmit frequency;
wherein the fractional-N phase lock loop is integrated into a transceiver of an integrated circuit, and wherein the integrated circuit includes the at least one decoder.

11. The system of claim 10, wherein the fractional-N phase lock loop is an inductor-capacitor fractional-N phase lock loop.

12. The system of claim 10, wherein the at least one fractional-N phase lock loop comprises:
a voltage controlled oscillator to generate an analog output signal;
a first converter to convert the analog output signal to a digital output signal;
a second converter to convert the analog reference signal produced by the reference oscillator to a digital reference signal;
a detector to receive the at least one digital frequency divider number, and to compare a frequency of the digital output signal with a frequency of the digital reference signal to produce a digital frequency error measurement; and
a third converter to convert the digital frequency error measurement to an analog frequency error measurement;
wherein the voltage control oscillator is configured to correct a frequency of the analog output signal based on the analog frequency error measurement.

13. The system of claim 12, wherein the first converter is a sigma-delta modulator.

14. The system of claim 12, wherein the second converter is a sigma-delta modulator.

15. The system of claim 12, wherein the third converter is a charge pump.

16. The system of claim 12, wherein the voltage controlled oscillator is an inductor-capacitor voltage controlled oscillator.

17. The system of claim 12, wherein the fractional-N phase lock loop further comprises an analog low pass filter to filter the analog frequency error measurement prior to being used by the voltage controlled oscillator.

18. The system of claim 12, wherein the detector is a phase frequency detector.

19. The system of claim 10, wherein the transceiver comprises a quad transceiver, and the fractional-N phase lock loop is integrated into the quad transceiver.

20. The system of claim 10, wherein the integrated circuit comprises a processor, and the fractional-N phase lock loop is integrated into the transceiver of the processor.

* * * * *